United States Patent
Nobusawa

[11] Patent Number: 6,029,055
[45] Date of Patent: Feb. 22, 2000

[54] FREQUENCY STABILIZATION CIRCUIT USING SIGNAL LEVEL THRESHOLD

[75] Inventor: Hideaki Nobusawa, Saitama, Japan

[73] Assignee: NEC Corporation, Tokyo, Japan

[21] Appl. No.: 08/965,671

[22] Filed: Nov. 6, 1997

[30] Foreign Application Priority Data

Nov. 15, 1996 [JP] Japan .................................. 8-318521

[51] Int. Cl.[7] .................................................. H04B 1/06
[52] U.S. Cl. .......................... 455/259; 455/75; 455/255; 331/1 R
[58] Field of Search ....................... 455/75, 192.1–192.3, 455/195.1, 255, 257–260, 264–265, 318; 327/105, 107, 147, 151, 154; 331/1 R, 2, 16, 18; 375/344

[56] References Cited

U.S. PATENT DOCUMENTS

| | | |
|---|---|---|
| 4,856,080 | 8/1989 | Hulkko . |
| 5,107,220 | 4/1992 | Andoh ................................. 327/105 X |
| 5,280,641 | 1/1994 | Ishii et al. ............................. 455/182.3 |
| 5,335,364 | 8/1994 | Heinonen .................................. 455/76 |
| 5,574,998 | 11/1996 | Andoh ................................. 455/182.2 |
| 5,621,757 | 4/1997 | Hori .................................... 455/260 X |

FOREIGN PATENT DOCUMENTS

| | | |
|---|---|---|
| 2-116760 | 5/1990 | Japan . |
| 2 056 800 | 3/1981 | United Kingdom . |

Primary Examiner—William G. Trost
Attorney, Agent, or Firm—Young & Thompson

[57] ABSTRACT

A frequency stabilization circuit includes a local oscillator, a mixer, a level comparator, a frequency comparator, and a controller. The local oscillator outputs a local oscillation signal in accordance with a control voltage. The mixer converts a received radio frequency signal into an intermediate frequency signal using the local oscillation signal from the local oscillator. The level comparator compares a DC voltage corresponding to the intermediate frequency signal from the mixer with a reference voltage to determine whether the reception electric field level of the radio frequency signal is high or low. The frequency comparator compares the frequency of the intermediate frequency signal from the mixer with the frequency of the reference signal to output frequency difference information. The frequency comparator outputs previous frequency difference information when the comparison result of the level comparator indicates a decrease in reception electric field level. The controller outputs the control voltage to the local oscillator in accordance with the frequency difference information from the frequency comparator.

15 Claims, 4 Drawing Sheets

6,029,055

FREQUENCY STABILIZATION CIRCUIT USING SIGNAL LEVEL THRESHOLD

BACKGROUND OF THE INVENTION

The present invention relates to a frequency stabilization circuit and, more particularly, to a frequency stabilization circuit for stabilizing an intermediate frequency signal from a received signal in a radio receiver such as a portable telephone.

FIG. 4 shows an example of a conventional frequency stabilization circuit of this type.

As shown in FIG. 4, the conventional frequency stabilization circuit comprises a voltage-controlled oscillator 13 serving as a local oscillator for generating a local oscillation signal S13, a mixer 1 which uses the local oscillation signal S13 from the voltage-controlled oscillator 13 to convert the frequency of an input radio frequency signal S1 and output an intermediate frequency signal S2, a limiter 2 for amplifying the intermediate frequency signal S2 output from the mixer 1 while limiting its amplitude, a reference oscillator 7 for oscillating a reference signal S7 having a frequency obtained by multiplying the frequency of the intermediate frequency signal S2 with an integer (N), a frequency divider 9 for dividing the frequency of the reference signal S7 into N, a frequency comparator 10 for comparing the frequency of an amplitude-limited, amplified intermediate frequency signal S3 with the frequency of a reference signal S8 obtained by dividing the frequency of the reference signal S7 into N, a controller 11 which outputs voltage data S11 for feedback-controlling the voltage-controlled oscillator 13 on the basis of frequency difference information S10 as the comparison result of the frequency comparator 10, and a D/A converter 12 for converting the voltage data S11 into a DC voltage.

With this arrangement, a frequency difference between the input signal S1 and the reference signal S7 is measured, and the oscillation frequency of the voltage-controlled oscillator 13 is feedback-controlled to stabilize the frequency of the amplified intermediate frequency signal S3 input to a demodulator 3.

In the use of the conventional frequency stabilization circuit for a portable telephone, when the reception electric field strength temporarily weakens upon movement of the portable telephone or the like, the SNR (Signal-to-Noise Ratio) of the output S3 from the limiter 2 decreases, and the frequency cannot be correctly compared and converges on an erroneous frequency, resulting in a reception error.

SUMMARY OF THE INVENTION

It is an object of the present invention to provide a frequency stabilization circuit in which the frequency does not converge on an erroneous frequency even when the reception electric field strength temporarily decreases.

In order to achieve the above object, according to the present invention, there is provided a frequency stabilization circuit comprising local oscillation means for outputting a local oscillation signal in accordance with a control voltage, mixer means for converting a received radio frequency signal into an intermediate frequency signal using the local oscillation signal from the local oscillation means, level comparison means for comparing a DC voltage corresponding to the intermediate frequency signal from the mixer means with a reference voltage to determine whether a reception electric field level of the radio frequency signal is high or low, frequency comparison means for comparing a frequency of the intermediate frequency signal from the mixer means with a frequency of the reference signal to output frequency difference information, the frequency comparison means outputting previous frequency difference information when a comparison result of the level comparison means indicates a decrease in reception electric field level, and control means for outputting the control voltage to the local oscillation means in accordance with the frequency difference information from the frequency comparison means.

DESCRIPTION OF THE PREFERRED EMBODIMENT

The present invention will be described below with reference to the accompanying drawings.

Figure 1:
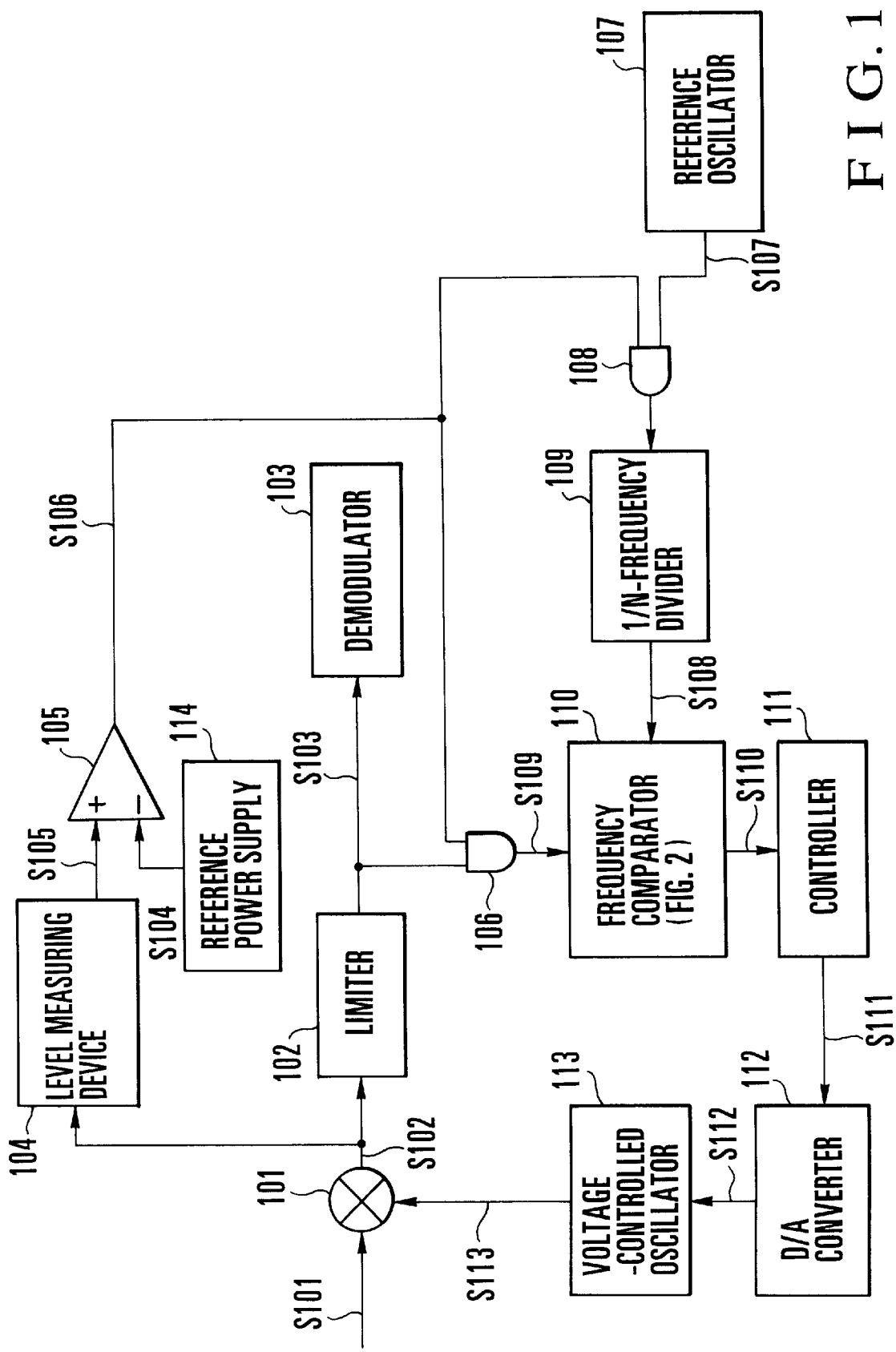
FIG. 1 is a block diagram of a frequency stabilization circuit according to an embodiment of the present invention.

FIG. 1 shows the arrangement of a frequency stabilization circuit according to an embodiment of the present invention. In FIG. 1, reference numeral 101 denotes a mixer for receiving a radio frequency signal S101 and a local oscillation signal S113 to output an intermediate frequency signal S102; 102, a limiter for amplifying the intermediate frequency signal S102 from the mixer 101 while limiting its amplitude; 103, a demodulator for demodulating an amplified intermediate frequency signal S103 output from the limiter 102; 104, a level measuring device for measuring the level of the intermediate frequency signal S102 from the mixer 101, and outputting a DC voltage S105 in accordance with the level; and 105, a comparator for comparing the DC voltage S105 from the level measuring device 104 with a reference voltage S104, and outputting a gate control signal S106.

Reference numeral 106 denotes a 2-input gate for receiving the amplified intermediate frequency signal S103 output from the limiter 102 and the gate control signal S106 from the comparator 105; 107, a reference oscillator for oscillating a reference signal S107 having a frequency obtained by multiplying the frequency of the intermediate frequency signal S102 with an integer (N); 108, a 2-input gate for receiving the reference signal S107 from the reference oscillator 107 and the gate control signal S106 from the comparator 105; 109, a frequency divider for dividing the reference signal S107 output from the gate 108 into N; 110, a frequency comparator for comparing the frequency of a measurement signal S109 output from the gate 106 with the frequency of a reference signal S108 from the 1/N-frequency divider 109; 111, a controller for outputting voltage data S111 on the basis of frequency difference information S110 as the comparison result of the frequency comparator 110; 112, a D/A converter for converting the voltage data S111 from the controller 111 into a DC voltage S112; 113, a voltage-controlled oscillator for generating the local oscillation signal S113 on the basis of the voltage data S112 output from the D/A converter 112, and outputting it to the mixer 101; and 114, a reference power supply for generating the reference voltage S104 and outputting it to the comparator 105.

The operation of the frequency stabilization circuit having this arrangement will be explained.

The frequency of the radio frequency signal S101 input to the mixer 101 is converted using the local oscillation signal S113 output from the voltage-controlled oscillator 113, thereby outputting the intermediate frequency signal S102 to the limiter 102 and the level measuring device 104. The level measuring device 104 always measures the reception electric field level of the intermediate frequency signal S102, and outputs the measurement value as the DC voltage S105 to the comparator 105.

The comparator 105 compares the DC voltage S105 from the level measuring device 104 with the reference voltage S104 from the reference power supply 114. When the DC voltage S105 representing the reception electric field strength of the intermediate frequency signal S102 becomes lower than the reference voltage S104, the comparator 105 outputs the gate control signal S106 of "L" level.

The intermediate frequency signal S102 is amplified by the limiter 102 while its amplitude is limited to a predetermined level. As a result, the amplified intermediate frequency signal S103 is output to the demodulator 103 and the gate 106. The reference oscillator 107 oscillates the reference signal S107 having a frequency N times the frequency of the intermediate frequency signal S102. The reference signal S107 via the gate 108 is divided into N by the frequency divider 109, and input as the reference signal S108 to the frequency comparator 110.

The frequency of the target measurement signal S109 output from the gate 106 is compared with the frequency of the reference signal S108 by the frequency comparator 110 to output the frequency difference information S110 to the controller 111. The frequency difference information S110 is converted into corresponding voltage data S111 by the controller 111. The voltage data S111 is output to the D/A converter 112 to be converted into the analog control voltage S112. The control voltage S112 is output to the voltage-controlled oscillator 113 to feedback-control the oscillation frequency of the voltage-controlled oscillator 113 in accordance with the frequency difference obtained in the frequency comparator 110.

When the reception electric field level of the intermediate frequency signal S102 falls, the gate control signal S106 output from the comparator 105 changes to "L" level, as described above. The gates 106 and 108 respectively disable the amplified intermediate frequency signal S103 and the reference signal S107 (S108). Accordingly, no frequency difference information S110 is output from the frequency comparator 110, whereas the oscillation frequency of the output-voltage-controlled oscillator 113 is locked and does not vary. As a result, the frequency is prevented from converging on an erroneous frequency when the reception electric field strength temporarily decreases.

Figure 2:
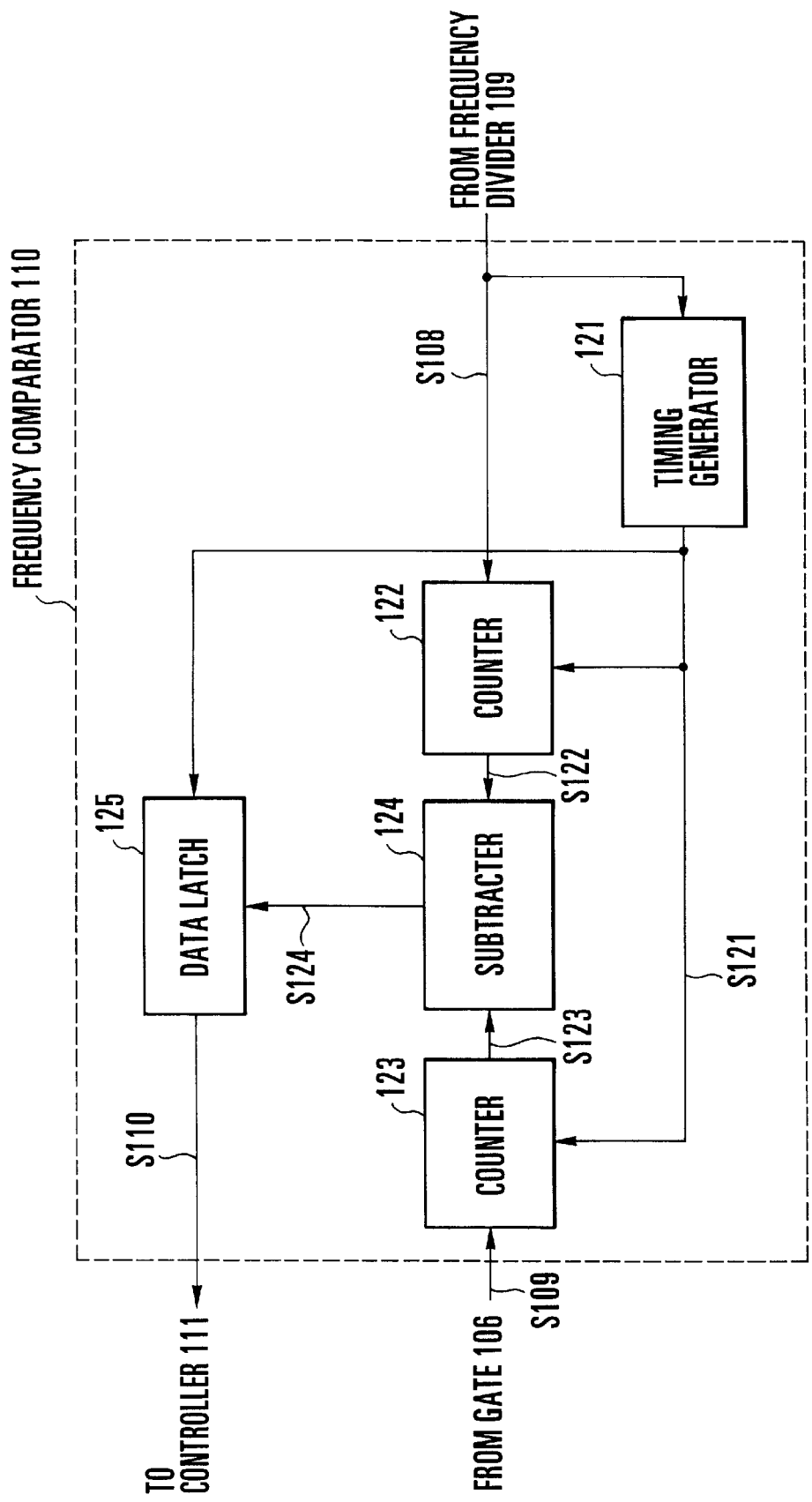
FIG. 2 is a block diagram showing an example of a frequency comparator shown in FIG. 1.

FIG. 2 shows an example of the frequency comparator 110 shown in FIG. 1. In FIG. 2, reference numeral 121 denotes a timing generator for receiving the reference signal S108 from the frequency divider 109 to output a timing signal S121; 122, a counter for counting the number of reference signals S108 in accordance with the timing signal S121; 123, a counter for counting the number of target measurement signals S109 from the gate 106 in accordance with the timing signal S121; 124, a subtracter constituting a data comparator for comparing a count value S122 of the counter 122 with a count value S123 of the counter 123 to output a count difference signal S124; and 125, a data latch for latching the count difference signal S124 in accordance with the timing signal S121.

The operation of the frequency comparator 110 shown in FIG. 2 will be described. Upon reception of the reference signal S108, the timing generator 121 generates the timing signal S121 for outputting the trigger every predetermined time. During the period determined by the timing signal S121, the counters 122 and 123 count the pulses of the reference signal S108 and the target measurement signal S109, and output the count values S122 and S123 to the subtracter 124, respectively. The subtracter 124 subtracts one of the count values S122 and S123 from the other, and outputs the subtraction result, i.e., the count difference signal S124 to the data latch 125. The data latch 125 latches the count difference signal S124 on the basis of the timing of the timing signal S121, and outputs the count difference signal S124 as the frequency difference information S110 within a predetermined time to the controller 111.

When the reception electric field level of the intermediate frequency signal S102 falls, the timing generator 121 does not operate because the reference signal S108 is disabled, as described above. For this reason, the frequency difference information S110 is maintained while the previous value is kept latched by the data latch 125, so that the oscillation frequency of the voltage-controlled oscillator 113 shown in FIG. 1 is maintained at the previous value.

Figure 3:
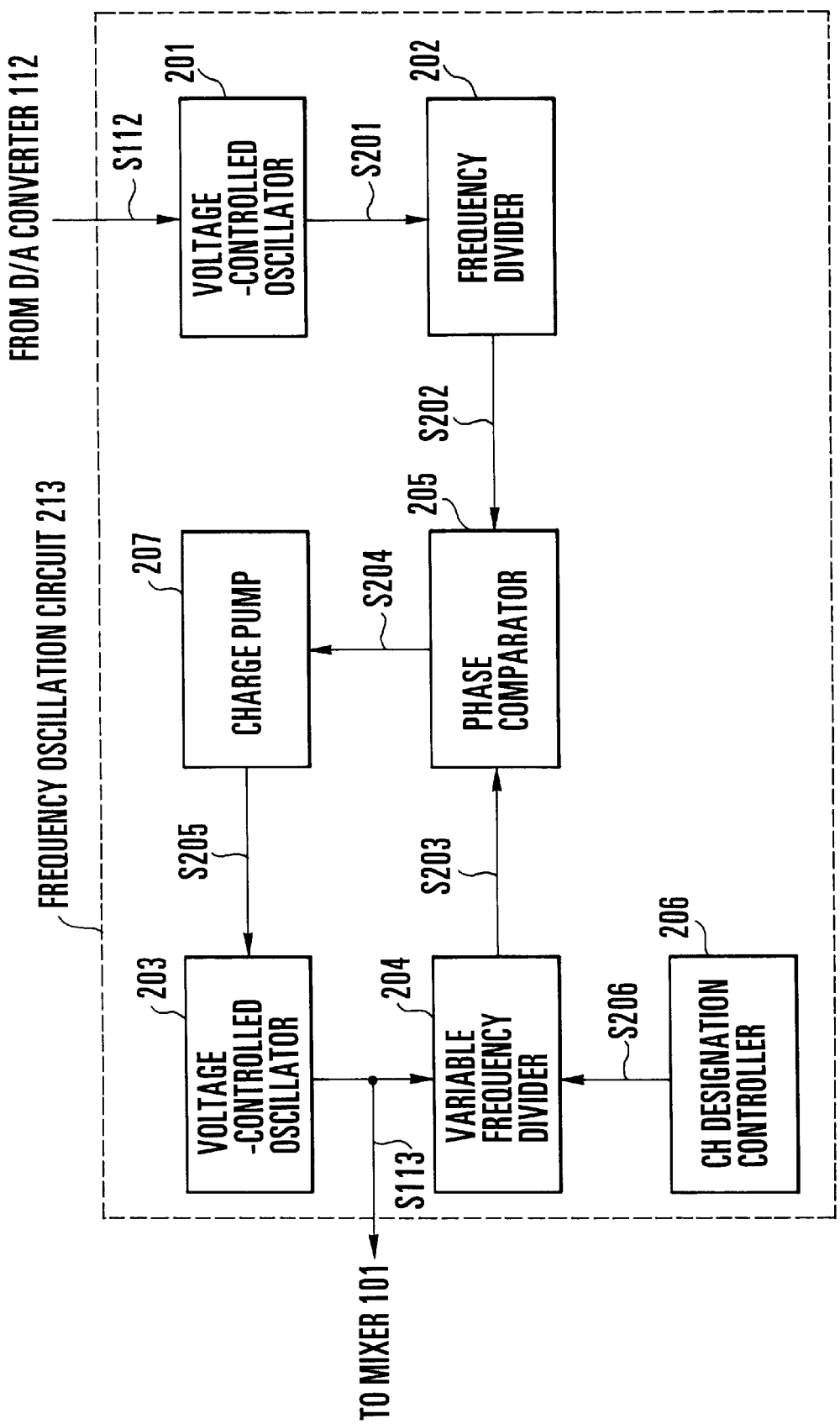
FIG. 3 is a block diagram showing an example of a frequency control circuit added in constituting a frequency stabilization circuit capable of selecting a desired CH frequency.
Figure 4:
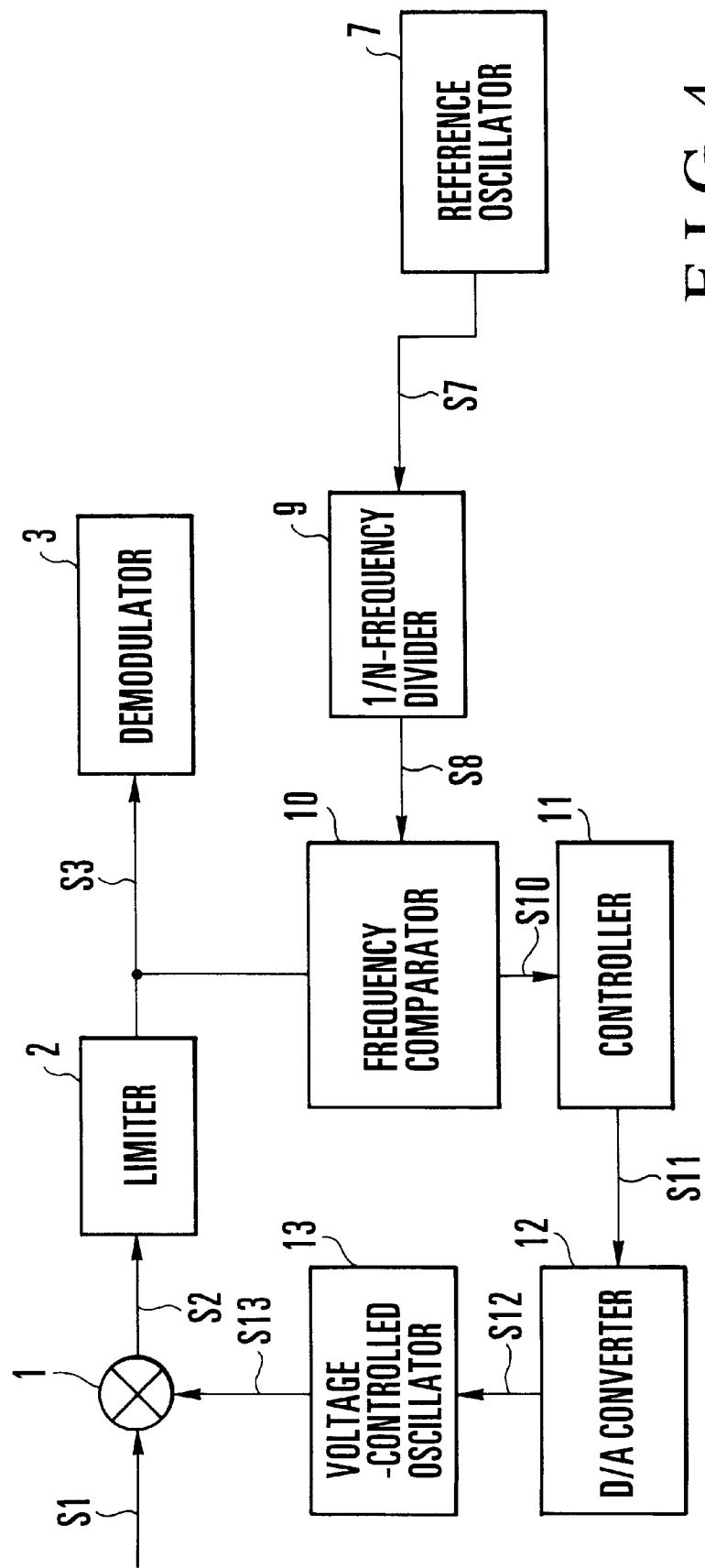
FIG. 4 is a block diagram of a conventional frequency stabilization circuit.

FIG. 3 shows a frequency oscillation circuit added in constituting a frequency stabilization circuit capable of selecting a desired channel (CH) frequency that is applied to a portable telephone or the like. The frequency stabilization circuit in this case is constituted by inserting a frequency oscillation circuit 213 shown in FIG. 3 instead of the voltage-controlled oscillator 113 shown in FIG. 1.

In FIG. 3, reference numeral 201 denotes a voltage-controlled oscillator for outputting a local oscillation signal S201 on the basis of the control voltage S112 from the D/A converter 112; 202, a frequency divider for dividing the frequency of the local oscillation signal S201 from the voltage-controlled oscillator 201 to output a reference signal S202; 203, a voltage-controlled oscillator for outputting the local oscillation signal S113 to the mixer 101 on the basis of a control voltage S205; 204, a variable frequency divider for variably dividing the frequency of the local oscillation signal S113 in accordance with frequency division data S206 to output a frequency-divided signal S203; 205, a phase comparator for comparing the phase of the frequency-divided signal S203 from the variable frequency divider 204 with the phase of the reference signal S202 from the frequency divider 202 to output a charge/discharge pulse signal S204; 206, a CH designation controller for outputting the frequency division data S206 corresponding to a channel to the variable frequency divider 204; and 207, a charge pump for repeatedly executing charge and discharge in accordance with the charge/discharge pulse signal S204 from the phase comparator 205 to output the control voltage S205 to the voltage-controlled oscillator 203.

The operation of the frequency oscillation circuit 213 shown in FIG. 3 will be described. When the control voltage S112 from the D/A converter 112 is input to the voltage-controlled oscillator 201, the voltage-controlled oscillator 201 outputs the local oscillation signal S201 corresponding to the control voltage S112. The local oscillation signal S201 from the voltage-controlled oscillator 201 is divided by the frequency divider 202 until the frequency of the CH band is obtained, and input as the reference signal S202 to the phase comparator 205.

The local oscillation signal S113 from the voltage-controlled oscillator 203 is output to the mixer 101. At the same time, the local oscillation signal S113 is divided by the variable frequency divider 204 with a frequency division number designated by the CH designation controller 206, and input as the frequency-divided signal S203 to the phase comparator 205.

The phase comparator 205 compares the phase of the reference signal S202 with the phase of the frequency-divided signal S203, and outputs the charge/discharge pulse signal S204 corresponding to a phase lead or delay to the charge pump 207. The charge pump 207 constituting an integrator integrates the charge/discharge pulse signal S204 to output the control voltage S205, thereby feedback-controlling the voltage-controlled oscillator 203.

Consequently, the local oscillation signal S113 from the voltage-controlled oscillator 203 converges on a desired CH frequency to minimize changes in charge/discharge pulse signal S204, making the control voltage S205 constant. When the control voltage S205 becomes constant, and a desired CH frequency is selected, the control voltage S112 input to the voltage-controlled oscillator 201 is stabilized by the circuit shown in FIG. 1.

When the reception electric field level of the intermediate frequency signal S102 shown in FIG. 1 falls, the frequency difference information S110 output from the frequency comparator 110 is kept latched at the previous value, as shown in FIG. 2. Therefore, the oscillation frequency of the voltage-controlled oscillator 203 is prevented from being varied by an erroneous frequency.

As has been described above, according to the present invention, since the previous frequency difference information is held even when the reception electric field level falls, the voltage-controlled oscillator is not controlled by an erroneous frequency, and the frequency is prevented from converging on an erroneous frequency to cause a reception error.

Since a circuit for stabilizing an intermediate frequency signal with respect to a desired channel frequency can be easily constituted, a frequency stabilization circuit suitable for the receiver section of a portable telephone or the like can be obtained.

What is claimed is:

1. A frequency stabilization circuit comprising:
   local oscillation means for outputting a local oscillation signal in accordance with a control voltage;
   mixer means for converting a received radio frequency signal into an intermediate frequency signal using the local oscillation signal from said local oscillation means;
   level comparison means for comparing a DC voltage corresponding to the intermediate frequency signal from said mixer means with a reference voltage to determine whether a reception electric field level of the radio frequency signal is higher or lower than said reference voltage;
   frequency comparison means for comparing a frequency of the intermediate frequency signal from said mixer means with a frequency of a reference signal to output frequency difference information, the intermediate frequency signal and the reference signal being interrupted to said frequency comparison means when a comparison result of said level comparison means indicates a decrease in reception electric field level; and
   control means for outputting the control voltage to said local oscillation means in accordance with the frequency difference information from said frequency comparison means.

2. A circuit according to claim 1, further comprising:
   first gate means for enabling/disabling the intermediate frequency signal from said mixer in accordance with an output from said level comparison means; and
   second gate means for enabling/disabling the reference signal in accordance with the output from said level comparison means,
   said first and second gate means stopping output of the intermediate frequency signal from said mixer and the reference signal to said frequency comparison means when the comparison result of said level comparison means indicates a decrease in reception electric field level below said reference voltage.

3. A circuit according to claim 2, wherein said frequency comparison means comprises:
   a first counter for counting up outputs from said first gate means;
   a second counter for counting up outputs from said second gate means;
   a data comparator for comparing count values of said first and second counters to output frequency difference information on the basis of a count difference; and
   a data latch for latching the frequency difference information from said data comparator at a predetermined period to output the latched frequency difference information to said control means.

4. A circuit according to claim 3, wherein said frequency comparison means further comprises a timing generator for outputting a timing signal at a predetermined period on the basis of the reference signal from said second gate means,
   said first and second counters count the outputs from said first and second gate means at a period of the timing signal from said timing generator, and
   said data latch latches the frequency difference information from said data comparator for each timing signal from said timing generator.

5. A circuit according to claim 1, further comprising:
   a reference power supply for generating a reference voltage to said level comparison means; and
   a reference oscillator for generating a fixed reference signal to said frequency comparison means.

6. A circuit according to claim 1, wherein said local oscillation means is constituted by a voltage-controlled oscillator.

7. A circuit according to claim 1, wherein said local oscillation means comprises:
   a first voltage-controlled oscillator for controlling an oscillation frequency on the basis of a first control voltage value obtained by converting the frequency difference information from said control means;
   a frequency divider for dividing the oscillation frequency of said first voltage-controlled oscillator;
   a second voltage-controlled oscillator for controlling an oscillation frequency on the basis of a second control voltage value;
   a variable frequency divider which has a frequency ratio set in accordance with a designated channel to divide the oscillation frequency of said second voltage-controlled oscillator with the set frequency ratio;
   a phase comparator for outputting a pulse signal in accordance with a phase difference between an output from said frequency divider and an output from said variable frequency divider; and an integrator for integrating a pulse signal from said phase comparator to output the second control voltage value to said second voltage-controlled oscillator.

8. A circuit according to claim 7, wherein said local oscillation means further comprises channel designation control means for setting frequency division data corresponding to the designated channel in said variable frequency divider.

9. A frequency stabilization circuit comprising:

local oscillation means for outputting a local oscillation signal in accordance with a control voltage;

mixer means for converting a received radio frequency signal into an intermediate frequency signal using the local oscillation signal from said local oscillation means;

level comparison means for comparing a DC voltage corresponding to the intermediate frequency signal from said mixer means with a reference voltage to determine whether a reception electric field level of the radio frequency signal is higher or lower than said reference voltage;

frequency comparison means for comparing a frequency of the intermediate frequency signal from said mixer means with a frequency of a reference signal to output frequency difference information, said frequency comparison means outputting previous frequency difference information when a comparison result of said level comparison means indicates a decrease in reception electric field level;

control means for outputting the control voltage to said local oscillation means in accordance with the frequency difference information from said frequency comparison means;

first gate means for enabling/disabling the intermediate frequency signal from said mixer in accordance with an output from said level comparison means; and second gate means for enabling/disabling the reference signal in accordance with the output from said level comparison means, said first and second gate means stopping output of the intermediate frequency signal from said mixer and the reference signal to said frequency comparison means when the comparison result of said level comparison means indicates a decrease in reception electric field level below said reference voltage.

10. A circuit according to claim 9, wherein said frequency comparison means comprises:

a first counter for counting up outputs from said first gate means;

a second counter for counting up outputs from said second gate means;

a data comparator for comparing count values of said first and second counters to output frequency difference information on the basis of a count difference; and a data latch for latching the frequency difference information from said data comparator at a predetermined period to output the latched frequency difference information to said control means.

11. A circuit according to claim 10, wherein said frequency comparison means further comprises a timing generator for outputting a timing signal at a predetermined period on the basis of the reference signal from said second gate means, said first and second counters count the outputs from said first and second gate means at a period of the timing signal from said timing generator, and said date latch latches the frequency difference information from said data comparator for each timing signal from said timing generator.

12. A circuit according to claim 9, further comprising:

a reference power supply for generating a reference voltage to said level comparison means; and a reference oscillator for generating a reference signal to said frequency comparison means.

13. A circuit according to claim 9, wherein said local oscillation means is constituted by a voltage-controlled oscillator.

14. A circuit according to claim 9, wherein said local oscillation means comprises:

a first voltage-controlled oscillator for controlling an oscillation frequency on the basis of a first control voltage value obtained by converting the frequency difference information from said control means;

a frequency divider for dividing the oscillation frequency of said first voltage-controlled oscillator;

a second voltage-controlled oscillator for controlling an oscillation frequency on the basis of a second control voltage value;

a variable frequency divider which has a frequency ratio set in accordance with a designated channel to divide the oscillation frequency of said second voltage-controlled oscillator with the set frequency ratio;

a phase comparator for outputting a pulse signal in accordance with a phase difference between an output from said frequency divider and an output from said variable frequency divider; and an integrator for integrating a pulse signal from said phase comparator to output the second control voltage value to said second voltage-controlled oscillator.

15. A circuit according to claim 14, wherein said local oscillation means further comprises channel designation control means for setting frequency division data corresponding to the designated channel in said variable frequency divider.

* * * * *